United States Patent [19]
Kobayashi

[11] Patent Number: 5,768,175
[45] Date of Patent: Jun. 16, 1998

[54] FERROELECTRIC MEMORY WITH FAULT RECOVERY CIRCUITS

[75] Inventor: Sota Kobayashi, Tokyo, Japan

[73] Assignee: NEC Corporation, Tokyo, Japan

[21] Appl. No.: 839,948

[22] Filed: Apr. 24, 1997

[30] Foreign Application Priority Data

Apr. 25, 1996 [JP] Japan ................................. 8-104880

[51] Int. Cl.$^6$ ................................................. G11C 11/22
[52] U.S. Cl. ........................... 365/145; 365/65; 365/72; 365/175
[58] Field of Search ............................ 365/145, 51, 65, 365/105, 72, 175

[56] References Cited

U.S. PATENT DOCUMENTS

| 5,297,077 | 3/1994 | Imai et al. | 365/145 |
| 5,517,445 | 5/1996 | Imai et al. | 365/145 |
| 5,615,144 | 3/1997 | Kimura et al. | 365/145 |
| 5,671,174 | 9/1997 | Koike et al. | 365/145 |

FOREIGN PATENT DOCUMENTS 5-249490  9/1993  Japan .

*Primary Examiner*—Do Hyun Yoo
*Attorney, Agent, or Firm*—Sughrue, Mion, Zinn, Macpeak & Seas, PLLC

[57] ABSTRACT

In a ferrolectric memory, semiconductor memory cells are arranged in a matrix array of rows and columns and connected respectively to plate lines, word lines and bit lines for changing polarization states of the capacitor of an addressed memory cell in response to operating voltages. First, second and third terminals are provided. A first set of conducting devices establishes branched paths from the first terminal to the plate lines when a first potential is applied to the first terminal, and a second set of conducting devices establishes branched paths from the second terminal to the word lines when a second potential is applied to the second terminal. A third set of conducting devices establishes branched paths from the third terminal to the bit lines when a third potential is applied to the third terminal. If the ferroelectric capacitor of at least one of the memory cells is short-circuited, a sufficient current will flow into the cell to heal the faulty condition.

10 Claims, 4 Drawing Sheets

FERROELECTRIC MEMORY WITH FAULT RECOVERY CIRCUITS

BACKGROUND OF THE INVENTION

1. Field of the Invention

The present invention relates to a ferroelectric memory in which an information bit is stored by utilizing the polarization states of the ferroelectric capacitance. The present invention is particularly useful for increasing the yield of ferromagnetic memories during manufacture.

2. Description of the Related Art

A ferroelectric memory is a matrix array of memory cells each comprising a field-effect transistor and a ferroelectric capacitor having predefined operating states. The capacitor of each memory cell changes its state in response to voltages applied to the cell. The memory array is fabricated on a semiconductor substrate such that the capacitor of each cell is formed on the transistor of the cell. Since the ferroelectric thin film of the capacitor is manufactured by a crystallization process, there is a chance of conductive foreign particles being introduced and crystallized with the ferroelectric material, forming a short-circuit path in the capacitance film. This results in a low yield of ferroelectric memories.

Japanese Laid-Open Patent Specification Hei-5-249490 discloses a TFT (thin-film transistor) display panel in which transistors and capacitors are arranged in a matrix of rows and columns on a semiconductor substrate and a method for healing a failed capacitor. The healing method involves submerging the panel in an electrolyte solution and applying a voltage to the panel. Although the prior art relates to the healing of a failed capacitor, it is not desirable to use electrolyte solution in a production line. In addition, there exists a need for repairing a faulty capacitor at user's premises.

SUMMARY OF THE INVENTION

It is therefore an object of the present invention to increase the yield of ferroelectric memories.

A further object of the present invention is to provide a ferroelectric memory that can be repaired at user's site as well as at production site.

The present invention is based on a healing characteristic exhibited by ferroelectric capacitors upon application of an appropriate voltage.

According to a broader aspect of the present invention, there is provided a memory comprising a plurality of plate lines, a plurality of word lines, a plurality of bit lines, and an array of semiconductor memory cells each including a ferroelectric capacitor and a transistor. The memory cells are connected respectively to the plate lines, the word lines and the bit lines for changing polarization states of the capacitor of each memory cell through the transistor in response to operating voltages applied to the memory cell. First, second and third terminals are provided. A plurality of first conducting means respectively establish a plurality of paths from the first terminal to the plate lines when a first potential is applied to the first terminal. A plurality of second conducting means respectively establish a plurality of paths from the second terminal to the word lines when a second potential is applied to the second terminal. A plurality of third conducting means respectively establish a plurality of paths from the third terminal to the bit lines when a third potential is applied to the third terminal. The first, second and third potentials are such that, if the ferroelectric capacitor of at least one of the memory cells has a short-circuit path, there is a sufficient current to burn out the short-circuit path.

According to a first specific aspect, the first conducting means are formed by a first semiconductor region of first conductivity type and a plurality of second semiconductor regions of second conductivity type opposite to the first conductivity type in the first conductivity region, the first semiconductor region being connected to the first terminal and the second semiconductor regions being respectively connected to the plate lines. The second conducting means are formed by a third semiconductor region of the first conductivity type and a plurality of fourth semiconductor regions of the second conductivity type in the third semiconductor region, the third semiconductor region being connected to the second terminal and the fourth semiconductor regions being respectively connected to the word lines. The third conducting means are formed by a fifth semiconductor region of the first conductivity type and a plurality of sixth semiconductor regions of the second conductivity type in the fifth semiconductor region, the fifth semiconductor region being connected to the third terminal and the sixth semiconductor regions being respectively connected to the bit lines.

According to a second specific aspect, a first pair of terminals, a second pair of terminals, and a third pair of terminals are provided. The first conducting means are formed by a first semiconductor region, a plurality of second semiconductor regions and a first conductive region extending between the first and second semiconductor regions, the first semiconductor region being connected to one of the first pair of terminals, the second semiconductor regions being respectively connected to the plate lines, and the first conductive region being connected to the other of the first pair of terminals. The second conducting means are formed by third semiconductor region, a plurality of fourth semiconductor regions and a second conductive region extending between the third and fourth semiconductor regions, the third semiconductor region being connected to one of the second pair of terminals, the fourth semiconductor regions being respectively connected to the word lines, and the second conductive region being connected to the other of the second pair of terminals. The third conducting means are formed by a fifth semiconductor region, a plurality of sixth semiconductor regions and a third conductive region extending between the fifth and sixth semiconductor regions, the fifth semiconductor region being connected to one of the third pair of terminals, the sixth semiconductor regions being respectively connected to the bit lines, and the third conductive region being connected to the other of the third pair of terminals.

BRIEF DESCRIPTION OF THE DRAWINGS

The present invention will be described in further detail with reference to the accompanying drawings, in which.

DETAILED DESCRIPTION

Figure 1:
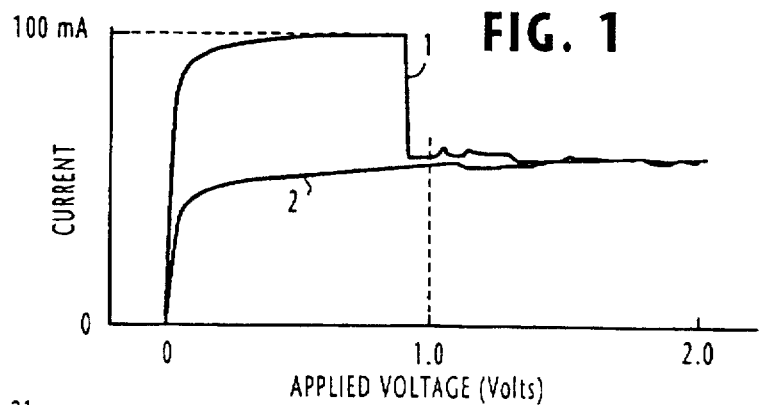
FIG. 1 is a graphic representation of current versus voltage relationship of a short-circuited ferroelectric capacitor.

The present invention is based on an experiment in which a short-circuited ferroelectric capacitance ($SrBi_2Ta_2O_9$) of thickness 200 nm and a size of 300 µm×300 µm was subjected to a voltage varying from 0 to 2 volts within a 5-second period. Curves 1 and 2 of FIG. 1 respectively indicate the currents obtained from first and second tests conducted in sequence. As indicated by curve 1, a surge current was observed as the applied voltage was swept from 0 to 1 volt. This surge current reached 100 mA when the voltage was 0.9 volts (since the actual size of a single cell of 1-Mb class is 3 µm×3 µm, the corresponding current will be much smaller than this value). As the voltage reached a 1-volt point, the current was sharply decreased to the normal level at which the current was thereafter maintained until the voltage reached 2 volts. When the capacitance was subjected to the same voltage sweep in the second test, no surge current occurred and the current generated was at normal level as indicated by curve 2. The same test was repeated but no surge current was observed. It was verified that the short-circuit condition of a ferroelectric memory can be healed by application of appropriate voltages to recover its normal ferroelectric characteristic. It was confirmed that a minimum of 5 volts is necessary for recovering a short-circuited ferroelectric memory cell. No other voltage source is therefore required for healing a short-circuit condition other than that used for the normal operation of the memory.

Figure 2:
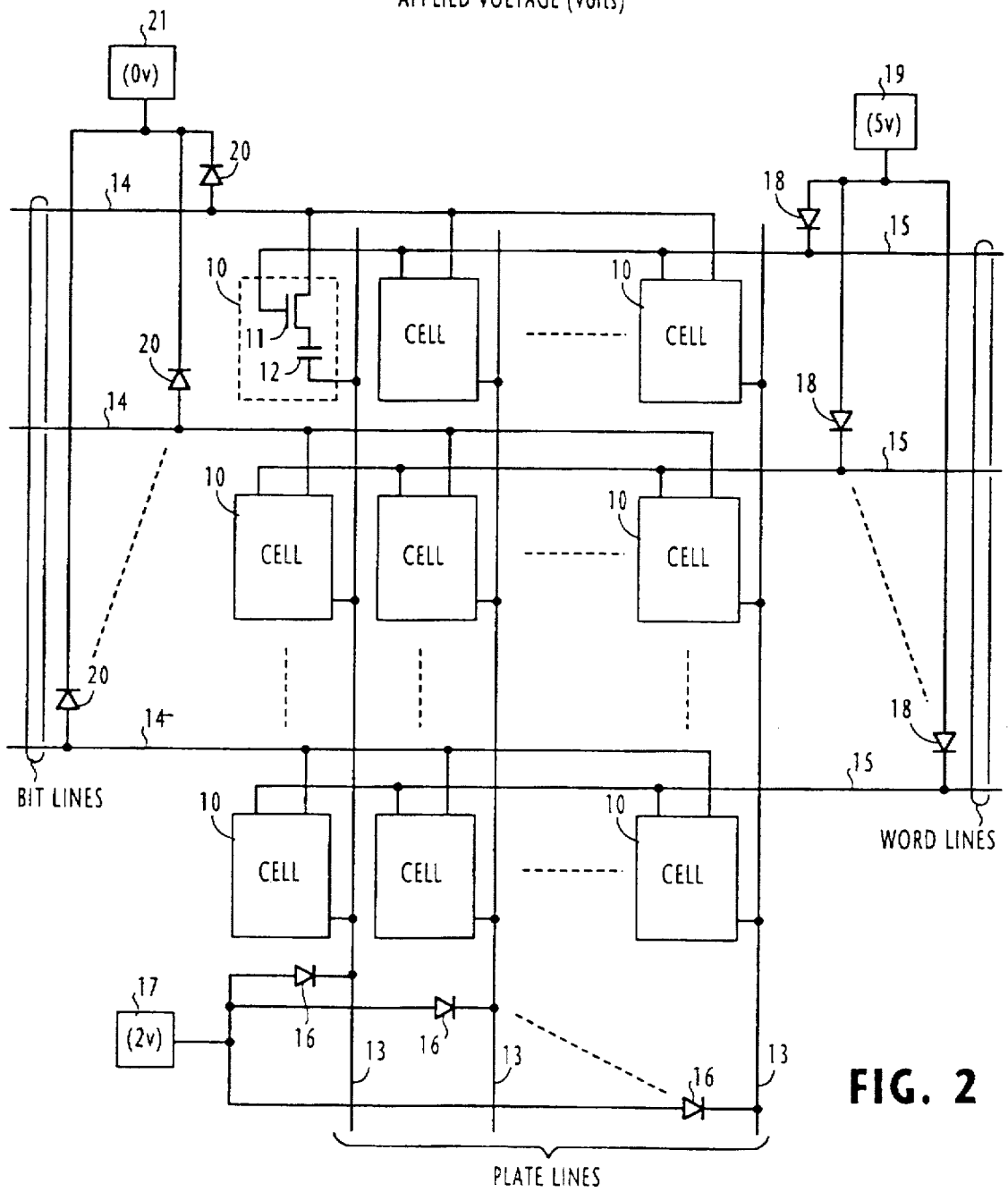
FIG. 2 is a circuit diagram of a ferroelectric memory array according to the first embodiment of the present invention.
Figure 3:
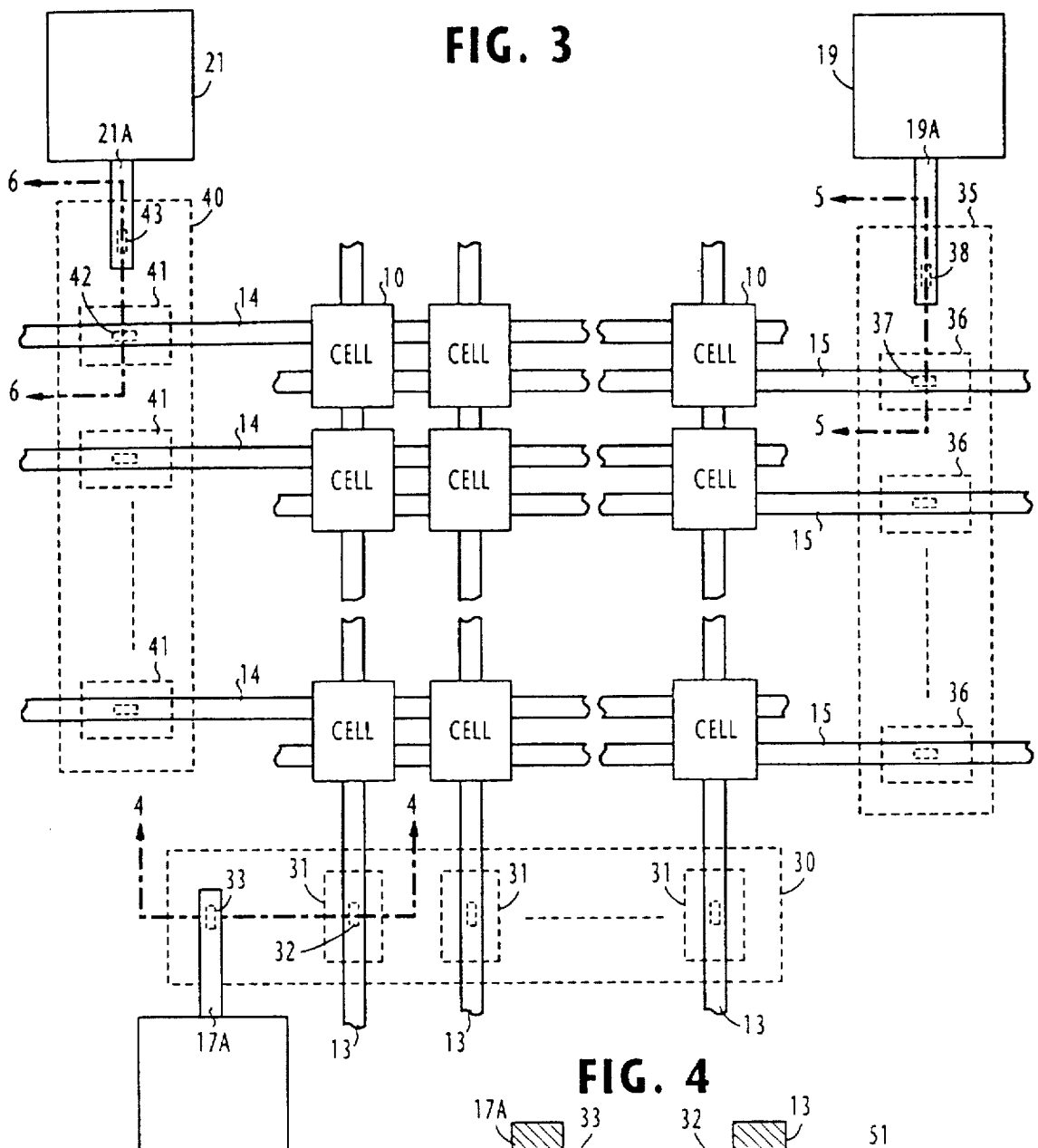
FIG. 3 is a block diagram illustrating the structural details of the memory of the first embodiment.

According to the present invention, the self-healing feature of FIG. 1 is incorporated in a non-volatile ferroelectric memory. As shown in FIG. 2, the memory comprises a matrix array of cells 10. Each memory cell comprises a field-effect transistor 11 and a ferroelectric capacitor 12. One end of the capacitor 12 is connected to a corresponding one of a plurality of plate lines 13 and the other end of the capacitor is connected through the source-drain path of the transistor 11 to a corresponding one of a plurality of bit lines 14. The control gate of transistor 11 is connected to a corresponding one of a plurality of word lines 15. Since the ferroelectric non-volatile memory is known in the art, the description of the structural details of each memory cell 10 is omitted for simplicity.

It will be appreciated that if the capacitor 12 of a memory cell is contaminated with conductive substances, they are converted to heat by a surge current when a set of appropriate voltages are applied to the memory cell.

In the first embodiment of this invention, the self-healing feature is implemented with diodes to establish branched paths from pad terminals 17, 19 and 21 to plate lines 13, word lines 15 and bit lines 14, respectively.

Specifically, a first set of diodes 16 is provided for the plate lines 13 by coupling their anodes together to the pad terminal 17 and coupling their cathodes respectively to the plate lines. In a similar manner, a second set of diodes 18 is provided for the word lines 15 with their anodes being connected together to the pad terminal 19 and their cathodes connected respectively to the word lines. For the bit lines 14, a third set of diodes 20 is provided with their cathodes being connected to the pad terminal 21 and their anodes connected to the respective bit lines.

Each of the pad terminals 17, 19 and 21 is of sufficient size to allow contact to be made with a probe or the like through which a voltage is supplied from an external source. A healing operation of the matrix array is performed with the application of a potential of 5 volts to pad terminal 19 and a ground potential to pad terminal 21. Under this condition, pad terminal 17 is subjected to a potential of 2 volts for a 3-second period. As a result, all diodes are forward-biased and the transistors of all memory cells are briefly turned on. If any of the memory cells is short-circuited, a surge current will be produced to recover the failed cell.

Such healing operations are performed for inspection during manufacture to significantly increase the yield of memories. The healing operation may also be performed on the user's side at intervals when all the memory cells are erased to recover short-circuit faults which may develop during use.

Advantageously, a minimum amount of space is required by integrating the fault recovery circuits on the same integrated-circuit chip with the memory array.

Structural details of the non-volatile memory of FIG. 2 with the integrated-circuit fault recovery circuits are shown in FIGS. 3 to 6. The first set of diodes 16 is formed by a p-type semiconductor region 30 on an n-type semiconductor substrate 50. This region serves as a common anode of the diodes 16. In the p-type region 30 are formed by diffusion a plurality of $n^+$-type semiconductor regions 31 in positions corresponding to plate lines 13 to serve as the cathodes of the individual diodes 16. Similarly, the second set of diodes 18 is formed by a p-type semiconductor region 35 on the n-type semiconductor substrate 50 to serve as a common anode. A plurality of $n^+$-type semiconductor regions 36 are formed within the p-type region 35 in positions corresponding to word lines 15 to serve as the cathodes of the individual diodes 18. The third set of diodes 20 is formed by an $n^+$-type region 40 in which a plurality of p-type regions 41 are formed in positions corresponding to bit lines 14.

Figure 4:
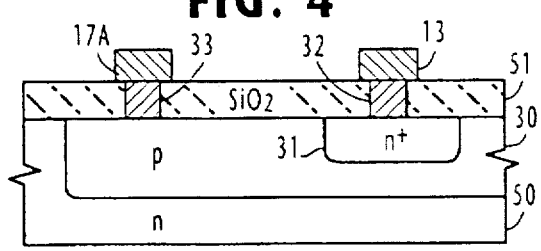
FIGS. 4, 5 and 6 are cross-sectional views taken along the lines 4, 5 and 6 of FIG. 3, respectively.
Figure 5:
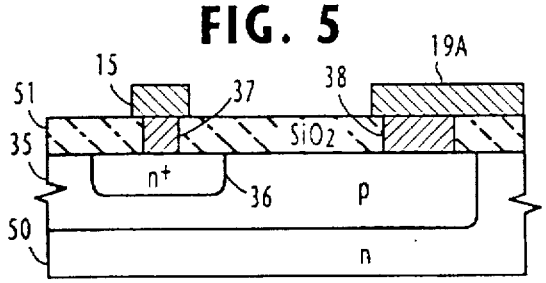
Figure 6:
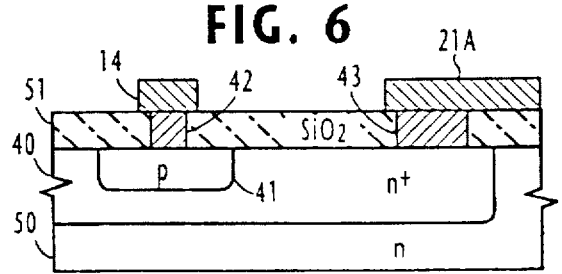

As clearly shown in FIGS. 4, 5 and 6, a silicon-dioxide layer 51 is then deposited over the surface of the memory and subsequently etched to form a plurality of contact holes 32, 37 and 42. These contact holes are then filled with polysilicon to establish conductive paths between $n^+$-regions 31 and plate lines 13, between $n^+$-type regions 36 and word lines 15, and between p-type regions 41 and bit lines 14. In addition, contact holes 33, 38 and 43 are formed in the layer 51 and then filled with polysilicon to provide conductive paths between a pad terminal extension 17A and the anode region 30, between a pad terminal extension 19A and the anode region 35, and between a pad terminal extension 21A and the common cathode region 40.

Figure 7:
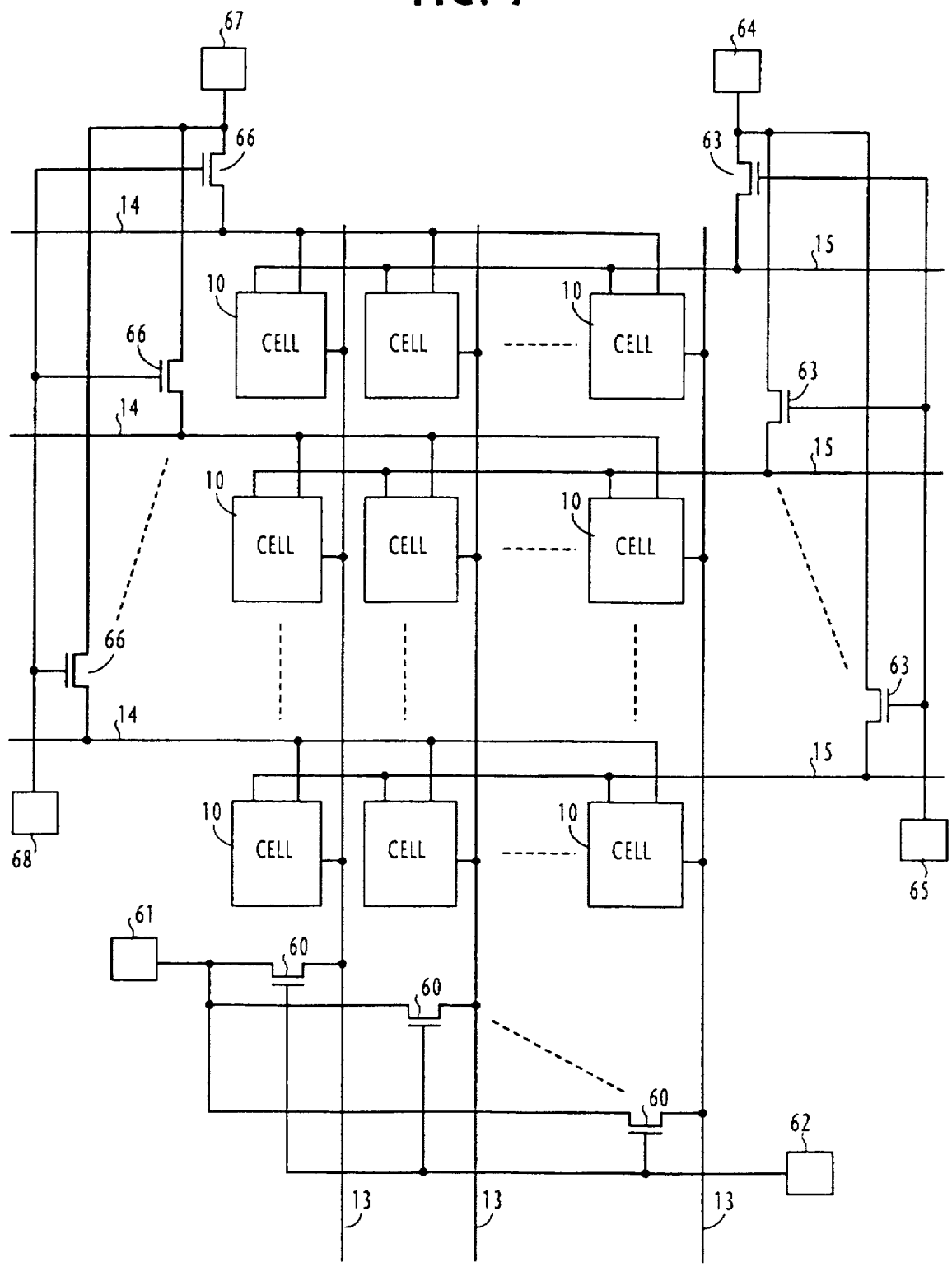
FIG. 7 is a circuit diagram of a ferroelectric memory array according to a second embodiment of the present invention.

In the second embodiment of this invention shown in FIG. 7, the self-healing feature is implemented with field-effect transistors to established switched branched paths from pad terminals 61, 64 and 67 to plate lines 13, word lines 15 and bit lines 14, respectively.

Specifically, a first set of transistors 60 is provided for the plate lines 13 by coupling their source-drain paths between the pad terminal 61 and the respective plate lines and their gate terminals to a pad terminal 62. Similarly, a second set of transistors 63 is provided for the word lines 15 by coupling their source-drain paths between the pad terminal 64 and the respective word lines and their gate terminals to a pad terminal 65. For the bit lines 14, a third set of transistors 66 is provided with their source-drain paths being connected between the pad terminal 67 and the respective bit lines and their gate terminals being connected to a pad terminal 68.

Figure 8:
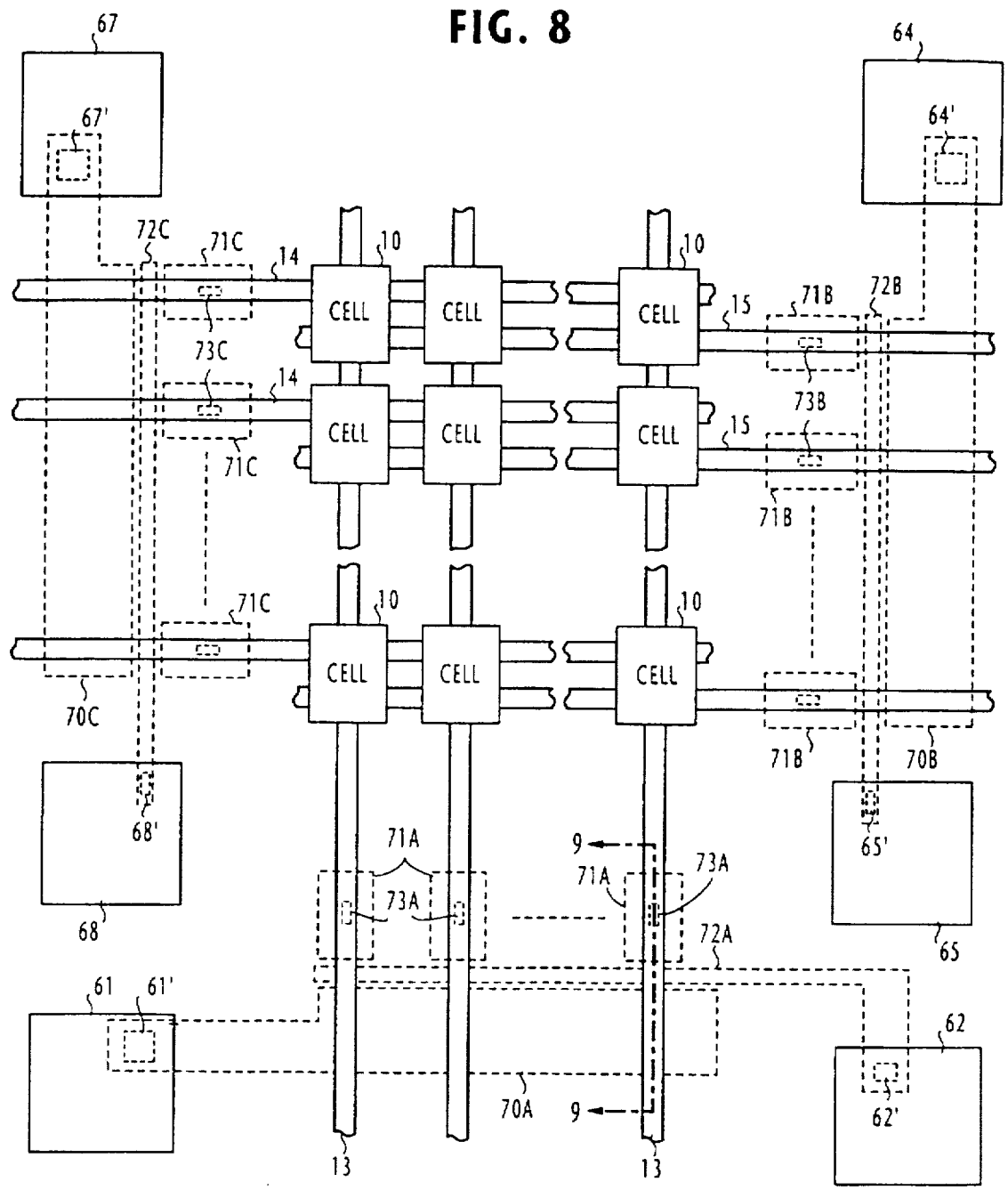
FIG. 8 is a block diagram illustrating the structural details of the memory of the second embodiment.
Figure 9:
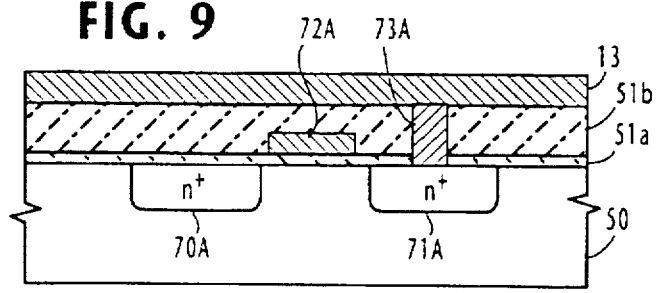
FIG. 9 is a cross-sectional view taken along the line 9 of FIG. 8.

Structural details of the non-volatile memory of FIG. 7 are shown in FIGS. 8 and 9. In the n-type substrate 50, the first set of transistors 60 is formed by a common source (n+-type) region 70A and a plurality of drain ($n^+$-type) regions 71A corresponding to plate lines 13. A thin silicon-dioxide layer 51a is deposited and a gate region 72A is formed thereon.

Further insulation is provided by a silicon-dioxide layer 51b on which the plate lines 13 are subsequently formed. Drain regions 71A and the corresponding plate lines are mutually connected by polysilicon through contact holes 73A. The source region 70A is connected to the pad terminal 61 through a contact hole 61' and the gate region 72A is connected to the pad terminal 62 through a contact hole 62'.

In the same manner, transistors 63 (66) are formed by a common source region 70B (70C), a plurality of drain regions 71B (71C) corresponding to word lines 15 (bit lines 14) and a gate region 72B (72C). Drain regions 71B (71C) and the corresponding word (bit) lines are mutually connected by polysilicon through contact holes 73B (73C). The source region 70B (70C) is connected to the pad terminal 64 (67) through a contact hole 64' (67') and the gate region 72B (72C) is connected to the pad terminal 65 (68) through a contact hole 65' (68').

What is claimed is:

1. A memory comprising:

a plurality of plate lines;

a plurality of word lines;

a plurality of bit lines;

an array of semiconductor memory cells each including a ferroelectric capacitor and a transistor, said memory cells being connected respectively to said plate lines, said word lines and said bit lines for changing polarization states of the capacitor of each memory cell through said transistor in response to operating voltages applied to the memory cell;

first, second and third terminals;

a plurality of first conducting means for respectively establishing a plurality of paths from said first terminal to said plate lines when a first potential is applied to said first terminal;

a plurality of second conducting means for respectively establishing a plurality of paths from said second terminal to said word lines when a second potential is applied to said second terminal; and a plurality of third conducting means for respectively establishing a plurality of paths from said third terminal to said bit lines when a third potential is applied to said third terminal, said first, second and third potentials being such that, if the ferroelectric capacitor of at least one of said memory cells has a short-circuit path, there is a sufficient current to burn out said short-circuit path.

2. A memory as claimed in claim 1, wherein each of said plurality of first, second and third conducting means comprises a diode.

3. A memory as claimed in claim 1, wherein each of said plurality of first, second and third conducting means comprises a transistor.

4. A memory as claimed in claim 1, wherein one of said first, second and third potentials is a voltage pulse.

5. A memory as claimed in claim 1, wherein said first, second and third potentials are within the range of the operating voltages of said memory cells.

6. A memory comprising:

a plurality of plate lines;

a plurality of word lines;

a plurality of bit lines;

an array of semiconductor memory cells each including a ferroelectric capacitor and a transistor, said memory cells being connected respectively to said plate lines, said word lines and said bit lines for changing polarization states of the capacitor of each memory cell through said transistor in response to operating voltages applied to the memory cell;

first, second and third terminals;

a first semiconductor region of first conductivity type and a plurality of second semiconductor regions of second conductivity type opposite to said first conductivity type in the first semiconductor region, said first semiconductor region being connected to said first terminal and said second semiconductor regions being respectively connected to said plate lines;

a third semiconductor region of said first conductivity type and a plurality of fourth semiconductor regions of said second conductivity type in said third semiconductor region, said third semiconductor region being connected to said second terminal and said fourth semiconductor regions being respectively connected to said word lines; and a fifth semiconductor region of said second conductivity type and a plurality of sixth semiconductor regions of said first conductivity type in said fifth semiconductor region, said fifth semiconductor region being connected to said third terminal and said sixth semiconductor regions being respectively connected to said bit lines.

7. A memory comprising:

a plurality of plate lines;

a plurality of word lines;

a plurality of bit lines;

an array of semiconductor memory cells each including a ferroelectric capacitor and a transistor, said memory cells being connected respectively to said plate lines, said word lines and said bit lines for changing polarization states of the capacitor of each memory cell through said transistor in response to operating voltages applied to the memory cell;

a first pair of terminals;

a second pair of terminals;

a third pair of terminals;

a first semiconductor region, a plurality of second semiconductor regions and a first conductive region extending between said first and second semiconductor regions, said first semiconductor region being connected to one of said first pair of terminals, said second semiconductor regions being respectively connected to said plate lines, and said first conductive region being connected to the other of said first pair of terminals;

a third semiconductor region, a plurality of fourth semiconductor regions and a second conductive region extending between said third and fourth semiconductor regions, said third semiconductor region being connected to one of said second pair of terminals, said fourth semiconductor regions being respectively connected to said word lines, and said second conductive region being connected to the other of said second pair of terminals;

a fifth semiconductor region, a plurality of sixth semiconductor regions and a third conductive region extending between said fifth and sixth semiconductor regions, said fifth semiconductor region being connected to one of said third pair of terminals, said sixth semiconductor regions being respectively connected to said bit lines, and said third conductive region being connected to the other of said third pair of terminals.

8. In a memory comprising a plurality of plate lines, a plurality of word lines, a plurality of bit lines, an array of semiconductor memory cells each including a ferroelectric capacitor and a transistor, said memory cells being connected respectively to said plate lines, said word lines and said bit lines for changing polarization states of the capacitor of each memory cell through said transistor in response to operating voltages applied to the memory cell, and first, second and third terminals, a method for recovering said memory from a faulty condition, comprising:

establishing a plurality of paths from said first terminal to said plate lines and applying a first potential to said first terminal;

establishing a plurality of paths from said second terminal to said word lines and applying a second potential to said second terminal; and establishing a plurality of paths from said third terminal to said bit lines and applying a third potential to said third terminal, said first, second and third potentials being such that, if the ferroelectric capacitor of at least one of said memory cells has a short-circuit path, there is a sufficient current to burn out said short-circuit path.

9. A method as claimed in claim 8, wherein one of said first, second and third potentials is applied as a voltage pulse.

10. A method as claimed in claim 8, wherein said first, second and third potentials are within the range of the operating voltages of said memory cells.

* * * * *